(12) United States Patent
Fukuda et al.

(10) Patent No.: US 6,670,641 B1
(45) Date of Patent: Dec. 30, 2003

(54) THIN FILM TRANSISTOR, METHOD OF MANUFACTURING THE SAME AND THIN FILM TRANSISTOR LIQUID CRYSTAL DISPLAY DEVICE

(75) Inventors: Kaichi Fukuda, Saitama-ken (JP); Tsutomu Uemoto, Saitama-ken (JP); Hideo Hirayama, Kanagawa-ken (JP); Shinichi Kawamura, Saitama-ken (JP); Shigetaka Toriyama, Saitama-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/574,067

(22) Filed: May 18, 2000

Related U.S. Application Data (62) Division of application No. 08/980,797, filed on Dec. 1, 1997, now Pat. No. 6,096,585.

(30) Foreign Application Priority Data

Nov. 29, 1996 (JP) .......................................... P08-318957

(51) Int. Cl.⁷ .......................... H01L 29/76; H01L 29/94
(52) U.S. Cl. .......................................... 257/66; 257/387
(58) Field of Search ................................. 257/387, 205, 257/66

(56) References Cited

U.S. PATENT DOCUMENTS 4,868,617 A * 9/1989 Chiao et al. ................ 357/23.3
4,946,799 A * 8/1990 Blake et al. .................... 437/41
5,621,236 A * 4/1997 Choi et al. .................... 257/387
5,719,430 A * 2/1998 Goto ........................... 257/346
5,753,543 A * 5/1998 Sandhu et al. ............... 438/163
5,763,301 A * 6/1998 Rha et al. .................... 438/149
5,834,343 A * 11/1998 Ogasawara et al. ......... 438/154
5,897,344 A * 4/1999 Teramoto et al. ...... 257/E29.117
6,208,390 B1 * 3/2001 Ejiri et al. ................... 349/149

FOREIGN PATENT DOCUMENTS

| EP | 0588370 | * | 3/1994 | |
|---|---|---|---|---|
| JP | 3-147334 | | 6/1991 | |
| JP | 404269837 | * | 9/1992 | ........ 438/FOR 183 |
| JP | 405006898 | * | 1/1993 | ........ 438/FOR 183 |
| JP | 406005624 | * | 1/1994 | ........ 438/FOR 183 |
| JP | 6-104279 | | 4/1994 | |
| JP | 406232398 | * | 8/1994 | |

* cited by examiner

Primary Examiner—Amir Zarabian
Assistant Examiner—Kiesha Rose
(74) Attorney, Agent, or Firm—Oblon, Spivak, McClelland, Maier & Neustadt, P.C.

(57) ABSTRACT

A thin film transistor (TFT) is provided with a precisely, lightly doped drain (LDD) structure formed on a substrate of insulators, such as a glass sheet. A method of making the TFT and a liquid crystal display device with the same are disclosed. The TFT with the LDD structure include a side wall and a gate insulation layer. An intermediate layer is provided between the side wall and the gate insulation layer. The intermediate layer is different in layer property from the side wall. When the side wall is formed by an anisotropic etching process, the etching can be stopped on the surface of intermediate layer. As a result, the gate insulation layer and the substrate are protected against the etching.

10 Claims, 8 Drawing Sheets

THIN FILM TRANSISTOR, METHOD OF MANUFACTURING THE SAME AND THIN FILM TRANSISTOR LIQUID CRYSTAL DISPLAY DEVICE

This application is a divisional of application Ser. No. 08/980,797 filed Dec. 1, 1997, now U.S. Pat. No. 6,096,585.

BACKGROUND OF THE INVENTION

1. Field of the Invention

This invention relates to a thin film transistor device with a lightly doped drain (called "LDD") structure, a method of manufacturing the same and a thin film transistor liquid crystal display device.

2. Discussion of the Background

A thin film transistor (called "a TFT") made of a polycrystalline silicon semiconductor layer (collectively called "a p-Si TFT") is now researched and developed in order to comply with requirements for the integration of driver circuits with a p-Si TFT array formed on a glass substrate of a liquid crystal display device.

It is well known that, similarly to a single crystalline silicon TFT, a breakdown or deterioration of the TFT characteristics takes place with a p-Si TFT when an excessively strong electric field is applied between the source and drain regions thereof. Such a phenomenon is mainly caused by the occurrence of hot carriers due to concentration of the electric field on a certain location in the vicinity of the drain region so that it becomes a more critical problem as the TFT becomes much finer in structure.

In order to solve those technical problems a lightly doped drain structure is effective as often used in a single crystalline TFT. Since, however, anisotropic etching, low temperature processes and so on are required for devices formed on a large glass plate, such as those used for a liquid crystal display, the single crystalline processes are not always directly applicable to the polycrystalline processes.

There have been proposed process techniques for forming an LDD structure TFT which are different from those for single crystalline processes. A side wall forming technique, for example, by means of anodic oxidation of the gate electrode is disclosed in Japanese Unexamined Patent Publication Hei 6-104279. A method of making use of side etching at the gate electrode is also disclosed in Japanese Unexamined Patent Publication Hei 5-17523. A method of making use of doping in a slant direction is further disclosed in Japanese Unexamined Patent Publication Hei 7-307477.

SUMMARY OF THE INVENTION

Those techniques are, however, not always satisfactory because a width control of the LDD region cannot be done well or process steps thereof are more complicated. Objects of this invention are to provide an LDD TFT with an easily formed and precise structure, a manufacturing method for such an LDD TFT, and a TFT liquid crystal display device to which such an LDD TFT is applied.

A method of making a TFT of the invention includes a few steps. In the first step, a semiconductor layer is formed on one main surface of a substrate made essentially of a glass material. The semiconductor layer is then subject to a patterning step through which it is made island-like in configuration. The main substrate surface and the semiconductor layer are coated with first and second films of an insulator and a conductor, respectively. Another patterning step is applied to the second film to form a gate electrode on the substrate. The gate electrode is laminated with third and fourth films which are different from each other in film property. An anisotropic etching step is performed for the third and fourth films to leave the third film on the gate electrode and to form a side wall thereof. This method is further provided with a step of implanting ions into the semiconductor layer through the side wall.

Alternatively, a method of making a TFT of the present invention is performed by another series of steps. In this method, a gate electrode is formed on a main surface of a substrate made essentially of a glass material. A first film of an insulator is formed on the gate electrode in the next step. A semiconductor layer is then formed on the first film and a patterning step is further applied to make the same and the gate electrode island-like in configuration. A second film is formed on the semiconductor layer. A projected portion or prominence is made on the second film through another patterning step. Third and fourth films which are different from each other in film property are laminated to cover the prominence on the main surface of the substrate. An anisotropic etching step is performed for the third and fourth films to leave the former and to form around the prominence. The method also has a step of implanting ions into the semiconductor layer through the side wall.

The present invention provides TFTs manufactured by the methods set forth above.

The invention further provides a TFT liquid crystal display device for which TFT pixel switches or/and drivers are used.

The above-stated and other objects and technical features of the present invention will become apparent from the following description when taken with the accompanying drawings. It will be understood, however, that the drawings are for purposes of illustration and are not to be construed as defining the scope of the invention, reference being had for the latter purpose to the claims appended hereto.

DESCRIPTION OF THE PREFERRED EMBODIMENT

Embodiments of the present invention will be explained hereinafter in detail with reference to the drawings.

First Embodiment

Figure 1:
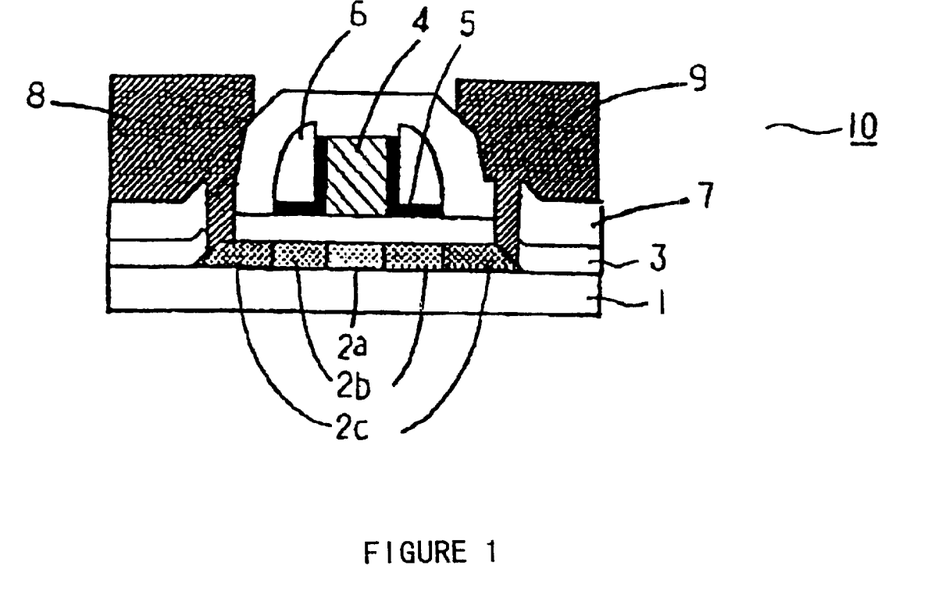
FIG. 1 is a sectional view of a TFT according to a first embodiment of the invention.

FIG. 1 shows a structure of a top gate type TFT 10. An insulation substrate 1 is made of a glass material, such as non-alkali glass or quartz glass. A semiconductor layer 2 with an island-like configuration is formed on the substrate. This semiconductor layer 2 has a non-doped channel region 2a in the center, LDD regions 2b in the vicinities of the non-doped channel region 2a where an impurity material is lightly doped, and lower resistance (source and drain) regions 2c in the vicinities of the LDD regions 2b where an impurity material is heavily doped. The channel region 2a may be slightly doped to achieve a threshold level. The LDD region may be also provided between the channel and drain regions or/and between the channel and source regions.

A gate insulation layer 3 is formed entirely to cover the semiconductor layer 2. On the gate insulation layer 3, a gate electrode 4 is formed at a location corresponding to the channel region 2a. An intermediate layer 5 is also formed to cover regions corresponding to the LDD regions 2b and the periphery of the gate electrode 4. A side wall 6 is formed around the gate electrode 4. The intermediate layer 5 is provided between the gate electrode 4 and the side wall 6. Further, an insulation film 7 is formed on the substantially entire surface. The source and drain electrodes 8 and 9 are formed to connect the lower resistance regions 2c through contact holes perforated through the insulation film 7 and the gate insulation layer 3.

A method of making such a TFT as set forth above will be explained with reference to FIGS. 2(a) through 2(f).

Figure 2A:
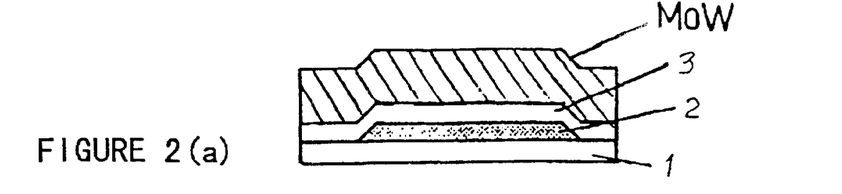
FIGS. 2(a) through 2(f) are production process diagrams of the TFT set forth in FIG. 1.

Silicon nitride ($SiN_x$) and silicon oxide ($SiO_2$) films are formed on one main surface of the glass substrate 1 as undercoat films. An amorphous silicon (a-Si) layer is then formed on the undercoat films. These three layers are made in accordance with sequential chemical vapor deposition (CVD) processes at the temperature of 350° C. The layers of $SiN_x$, $SiO_2$ and a-Si are 0.05 $\mu$m, 0.1 $\mu$m and 0.05 $\mu$min thickness, respectively.

Next, where a lot of hydrogen is included in the a-Si layer, a dehydrogenation annealing process may be performed at the temperature of 500° C. for five hours, for instance.

The dehydrogenation prevents the a-Si layer from being damaged by ablation resulting from hydrogen remaining therein in the following annealing poly-crystallization process by means of an excimer laser. However, if not too much hydrogen is not included in the a-Si layer, i.e., if its density is 1 atom % or less, such a dehydrogenation process is unnecessary.

In the next process a, XeCl excimer laser with wavelength of 308 nm is irradiated onto the a-Si layer so that the a-Si layer is changed into a polycrystalline silicon (p-Si) layer. The excimer laser is shaped into a linear beam through optical systems, and the energy density of such a linear beam ranges preferably from 300 mJ/cm$^2$ to 450 mJ/cm$^2$. A large a-Si area is poly-crystallized by scanning the linear excimer laser beam. The p-Si layer is further processed through a photolithography technique to make the semiconductor layer 2 island-like in configuration.

A 0.1 $\mu$m thick silicon oxide film is then formed to cover the semiconductor layer 2 by applying a plasma enhanced chemical vapor deposition (PECVD) method thereto as one of the CVD methods. Thus, the gate insulation layer 3 is formed as shown in FIG. 2(a). At least gases consisting of Si and O are used as film forming gases. In the present embodiment, gases mixed with tetraethoxysilane and nitride oxide ($N_2O$) are used. Other film forming gases, such as $SiH_4$, $Si_2H_6$ and the like, may be used. A pressure controllable oxygen gas may also be used separately as a single gas.

A 0.3 $\mu$m thick molybdenum tungsten (MoW) alloy is then formed by a sputtering process. An etching process based upon photolithography is applied thereto to make the gate electrode 4. The thickness of the gate electrode 4 is preferably subject to change in accordance with the width of the side wall 6. From a view point of process control, the former is desirably equal to the latter or more. When the sidewall 6 is 0.2 $\mu$m in width, the gate electrode 4 is 0.25 $\mu$m in thickness or more, e.g., 0.3 $\mu$m in this case. Further, in order to carry out vertical etching in the process, anisotropic dry etching using a reactive ion, for instance, is applied to the alloy.

Figure 2B:
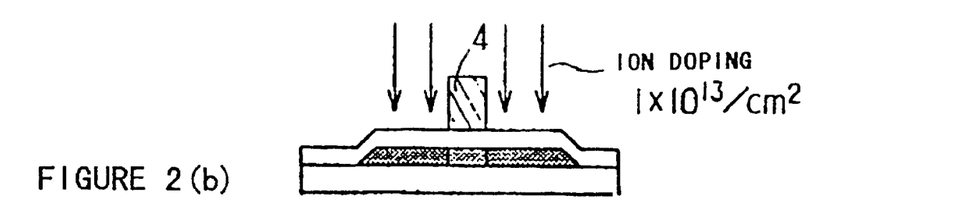

As shown in FIG. 2(b), the gate electrode 4 is used as a mask when an impurity material of phosphorus is doped low in density into the semiconductor layer 2. As a doping process an ion-implantation is carried out under such conditions as, preferably, a dose of $1\times10^{13}/$ cm$^2$ and an acceleration voltage of 65 kV. In this process, ions generated under the occurrence of plasma are accelerated by an acceleration electrode so that the doping is performed. A doping equipment performing this doping method is rather simple in structure. The doping method is also suitable for doping ions into a large area.

Figure 2C:
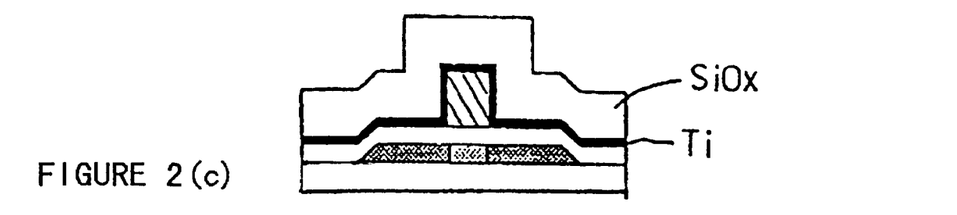
Figure 2D:
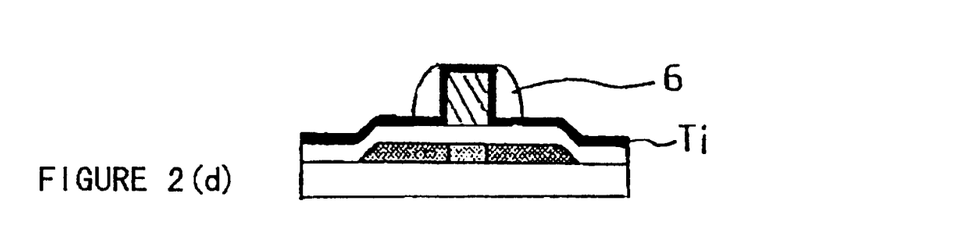

As shown in FIG. 2(c), a titanium (Ti) layer is formed by a sputtering method. The layer is 0.05 $\mu$m in thickness to cover the gate electrode 4. A 0.4 $\mu$m thick $SiO_2$ film is formed in accordance with a PECVD method. A reactive ion etching (RIE) process is applied to the $SiO_2$ layer for performing anisotropic etching. However, the etching process is stopped on the surface of the Ti layer to leave such a side wall 6 as shown in FIG. 2(d) while slight etching of the Ti surface is permissible.

If the etching conditions of a 400 mm×500 mm substrate, for example, are as follows:

gas flow of ; 200 sccm $CHF_3$ and 20 scam $O^2$;

gas pressure of; 50 mmTorr; and electric power of ; 1,000 W;

the silicon oxide achieves the etching speed of approximately 500 Å/min so that its etching selection ratio to Ti or MoW alloy is firmly equal to 10 or more. Even if the etching conditions are:

gas flow of ; 100 scam $CHF_3$ and 400 sccm CO;

gas pressure of ; 40 mmTorr; and electric power of; 1,000 W;

or gas flow of; 200 sccm $CF_4$ and 50 sccm $H_2$;

gas pressure of; 30 mmTorr, and electric power of; 1,000 W ;

the equivalent effect can be substantially obtained from both cases. When the side wall 6 is formed by anisotropic etching of the silicon oxide, the Ti intermediate layer 5 functions as a protector of the substrate 1. In the embodiment of the present invention, since the semiconductor layer 2 is processed to form an island-like configuration, parts of the substrate 1 exist directly underneath the gate insulation layer 3. In this case, if the intermediate layer 5 were not provided, the anisotropic in etching would etch not only the gate insulation layer 3 but also the substrate 1. Thus, the intermediate layer 5 of the present invention has an advantage to prevent such that etching.

In the next step, the intermediate layer 5 is patterned by the anisotropic etching of the Ti intermediate layer 5 through the side wall 6 as a mask pattern. Where the etching conditions of the 400 mm×500 mm substrate are:

gas flow of; 200 sccm $CF_4$ and 100 sccm $O_2$;

gas pressure of; 50 mmTorr; and electric power of; 500 W;

the Ti etching speed achieves approximately 3,000 Å/min so that the etching selection ratio is consistently 10 or more against the gate insulation layer made of silicon oxide. Alternatively, when the etching conditions are:

gas flow of; 500 sccm $SF_6$, 400 sccm $O_2$ and 10 sccm $Cl_2$;
gas pressure of; 30 mmTorr; and
electric power of; 1,000 W;

the effect equivalent to the previous case can be substantially obtained.

Figure 2E:
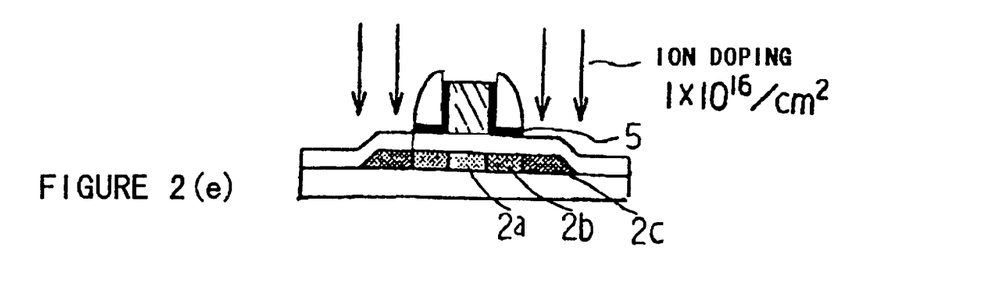

Doping a high density phosphorus material, for instance, is then performed through a mask consisting of the gate 4, the intermediate layer 5 and the side wall 6 as shown in FIG. 2(e). Ion implantation is suitable for the doping under such conditions as a dose of $1 \times 10^{16}$ /cm$^2$ and an acceleration voltage of 65 kV. It is noted that the intermediate layer 5 may be left as, shown in FIG. 2(d) where ions are implanted into the semiconductor layer 2 through the layer 5. In other words, the etching process for the intermediate layer 5 may be unnecessary, if the ions pass through the intermediate layer 5 to make LDD regions in the semiconductor and if the intermediate layer 5 is made of an insulation material.

In order to activate doped ions, annealing of the device is performed at 600° C. for one hour in a nitrogen atmosphere. Alternatively, optical annealing activation using an excimer laser or the like may be carried out. Since such optical annealing activation can be done at a lower substrate temperature, a lower cost glass substrate may be used.

In order to terminate dangling bonds remaining in the semiconductor layer 2, the device is exposed to hydrogen plasma, i.e., a hydrogenation process is performed on the device. This hydrogenation may be carried out in PECVD equipment where the insulation layer of silicon oxide is formed in the next step. Thus, the insulation film 7 can be formed subsequently in the same CVD equipment without exposing the device to air. The insulation film 7 is formed to cover the entire substrate in the next step in the plasma CVD equipment.

Figure 2F:
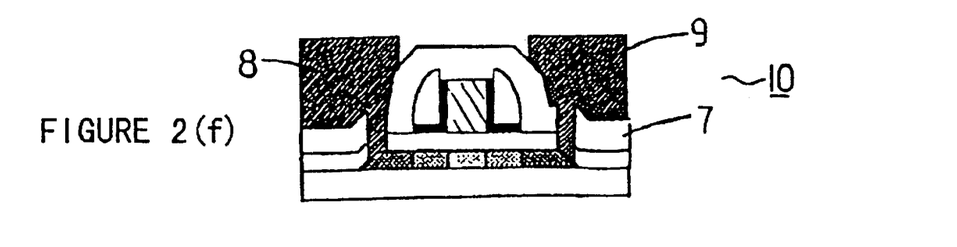

The contact holes are then made by means of a photolithography technique to etch and remove the contact hole portions of the gate insulation layer 3 and the insulation film 7 corresponding to those of the low resistance regions 2c. Further, a sputtering method is applied to form a 0.5 μm thick Al layer. The Al layer is connected to the low resistance region 2c through the contact holes. Finally, as shown in FIG. 2(f), the source and drain electrodes 8 and 9 are patterned also by means of a photolithography technique. A desired TFT 10 is produced in this way.

The TFT 10 of the present invention includes the intermediate layer 5 provided between the gate insulation layer 3 and the side wall 6, as set forth above. The intermediate layer 5 is different in layer property from the side wall 6 so that the former prevents the gate insulation layer 3 from being damaged in the etching process to form the side wall 6.

Such "different layer property" means a different etching speed under predetermined conditions of the anisotropic etching when forming the side wall 6. In other words, two layers 5 and 6 with the different layer properties define an etching selection ratio between the etching speed for the layer side wall 6 and that for the intermediate layer 5. The etching selection ratio is 5 or more and, more preferably, 10 or more. If the etching selection ratio of an identical material layer varies in accordance with its composition, impurity concentration, layer forming conditions or the like, the layers with such different conditions are regarded as those with "different layer properties".

Where the intermediate layer 5 is made of an electrically conductive material as in the present embodiment, the intermediate layer 5 becomes effectively a part of the gate electrode 4 so that the gate electrode 4 may be overlapped in structure with the LDD regions 2b. The intermediate layer 5 may consist preferably of a material selected from Ti, Mo, W, Ta and Al, for instance. The structure eases electric fields at the LDD edges in a manner similar to the ordinary LDD structure and reduces the decrease of an "ON" current due to a series resistance in the LDD regions 2b. The intermediate layer 5 made of semiconductor materials may obtain substantially the same effect however lower resistance materials due to doped impurities are suitably used for this case.

If the intermediate layer 5 is made of insulating materials, on the other hand, other different effects are obtained. Although the intermediate layer 5 made. of electrically conductive materials has the effect set forth above, the layer 5 causes increase of a parasitic capacitance. Where the intermediate layer 5 is made of insulating materials, however, the layer 5 avoids increase of such a parasitic capacitance. Since the increase of stray capacitors is not desirable for pixel switching TFTs used in a liquid crystal display device, the insulation intermediate layer is, thus, suitable for the pixel switching TFTs. The insulating materials are, for instance, silicon oxide, silicon nitride, silicon oxynitride, or the like but they must be different in layer property from the side wall, as described above.

It is desirable from view points of an etching selection ratio, configuration control, and TFT characteristics that the material of side wall 6 is selected from silicon oxide, silicon nitride, and silicon oxynitride. As a material of the side wall 6, the silicon oxide or the silicon oxynitride is much better than the silicon nitride. It is because that an isotropic etching speed in a radical state for those layers has a tendency to be much slower than an ion-applied anisotropic etching speed. In particular, a silicon oxide layer formed by using organic silane, e.g., tetraethoxysilane (TEOS), is better in isotropic coating property of the gate electrode and also better in shape-controllability of the side wall.

In the embodiment described above, the silicon oxide layer is used for the gate insulation layer 3 to obtain good transistor characteristics. Further, the intermediate layer 5 is provided in accordance with the present invention so that the silicon oxide layer may be also used for a material of the side wall 6. In summary, according to the present invention, the same material as used for the gate insulation layer 3 or a material with a low etching selection ratio to the intermediate layer 5 may be chosen as a material of the side wall 6.

The silicon oxide layer formed by using organic silane has a distinctive feature that it contains carbon. If the carbon is low in concentration in the case that the silicon oxide layer so formed is used for the side wall, its coating property becomes poor. If the carbon, however, is high in concentration, it also raises such a problem that the electric insulation thereof is not satisfactory. The inventors have discovered a preferable carbon concentration range from $1 \times 10^{18}$/cm$^3$ through $1 \times 10^{21}$/cm$^3$. Although the LDD regions are formed on the both sides of the channel region in this embodiment, only one LDD region may be provided on the drain or source side of the channel region.

Second Embodiment

Figure 3A:
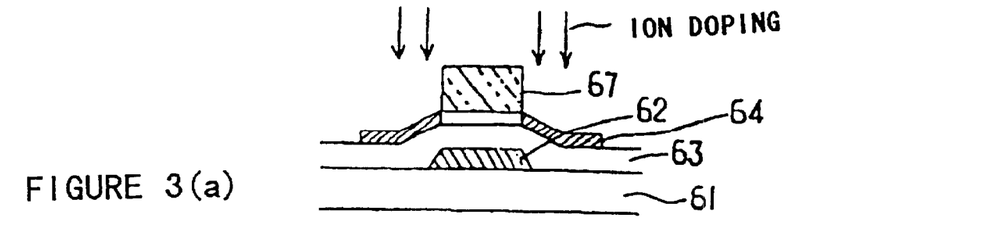
FIGS. 3(a) through 3(e) are production process diagrams of a TFT according to a second embodiment of the invention.
Figure 3B:
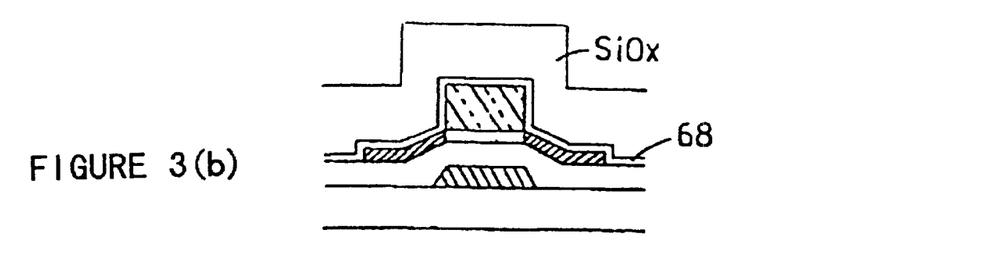
Figure 3C:
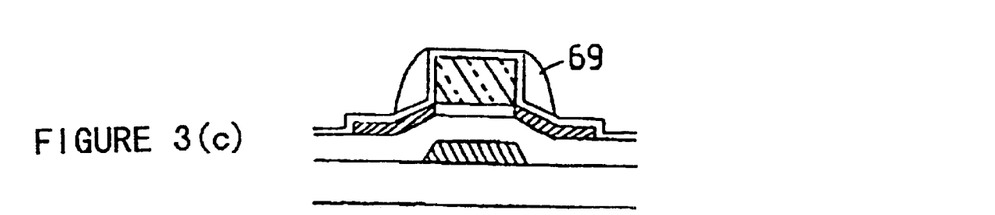

The structure of a bottom gate-type TFT 60 will be described with reference to FIG. 3(e). A gate electrode 62 is formed and patterned on the insulation substrate 61. A gate insulation layer 63 is provided to cover the gate electrode 62.

On gate insulation layer 63 is formed and patterned a semiconductor layer 64 which has a channel region 64a at the center, lower density impurity doped (or lightly doped drain/source (LDD)) regions 64b provided at the edges of channel region 64a, and higher density impurity doped, lower resistance regions 64c next to the LDD regions 64b.

Source and drain electrodes 65 and 66 are connected to these lower resistance regions 64c, respectively. A projection portion or prominence 67 is formed on channel region 64a of the semiconductor layer 64. An intermediate layer 68 and side wall 69 are formed on the LDD regions 64b.

With reference to FIGS. 3(a) through 3(e) a method of making a TFT will be described hereinafter.

A metal layer of MoW, MoTa, Cr, or Al is formed on one main surface of insulation substrate 61 made of a glass sheet, for instance, and is patterned to make the gate electrode 62.

A gate insulation layer 63 of silicon nitride or silicon oxide, for instance, is formed entirely to cover the gate 62. A p-Si layer is formed on the gate insulation layer 63 to function as the semiconductor layer 64. Techniques to make such a p-Si layer are the same as in the first embodiment.

An impurity material is doped into the semiconductor 64 around the prominence 67 as shown in FIG. 3(a). The intermediate layer 68 is formed to cover the prominence 67 and, then, a silicon oxide film, for in stance, is formed to cover the intermediate layer 68 as shown in FIG. 3(b). Anisotropic etching, e.g., reactive ion etching (RIE) is applied to the silicon oxide film. The anisotropic etching is stopped on the surface of intermediate layer 68 to form the side wall 69 as shown in FIG. 3(c) in accordance with the etching selection ratio thereof which is different from the intermediate layer 68. Further, an etching gas is changed to eliminate exposed portions of the intermediate layer 68 by using the side wall 69 as a mask.

Figure 3D:
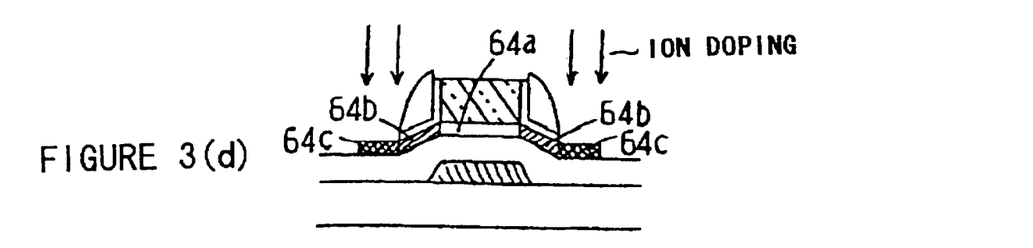
Figure 3E:
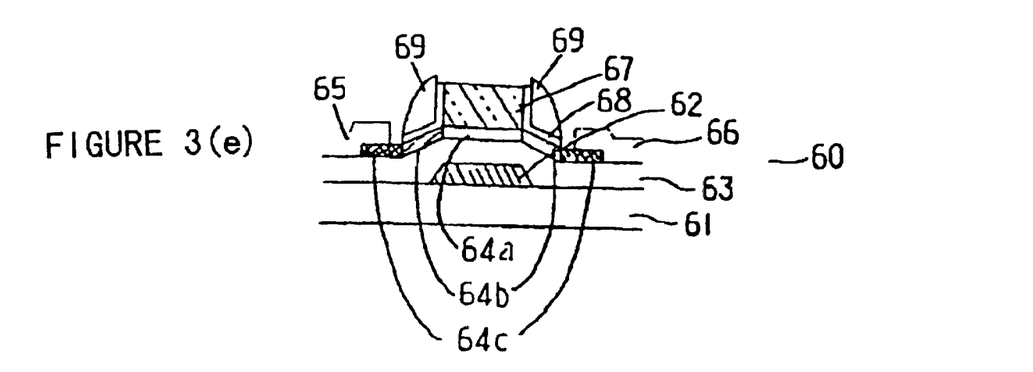

The impurity material is again doped into the semiconductor layer to make the lower resistance regions 64c by using the prominence 67, the layer 68 and the side wall 69 as masks, as schematically shown in FIG. 3(d). The source and drain electrodes 65 and 66 are formed to connect the lower resistance layers 64c, respectively, so that a TFT is made after all, as shown in FIG. 3(e). In this TFT of the second embodiment of the invention, the prominence 67, the intermediate layer 68 and the side wall 69 may be eliminated after the impurity doping to make the lower resistance regions 64c. In the event that these are not eliminated, they are preferably made from insulating materials.

In addition, although the prominence 67 is directly formed on the semiconductor layer 64 in this embodiment, another insulating film may be provided between the semiconductor layer 64 and the prominence 67.

Third Embodiment

A liquid crystal display device will be explained with reference to FIGS. 4 and 5 in detail hereinafter.

Figure 4:
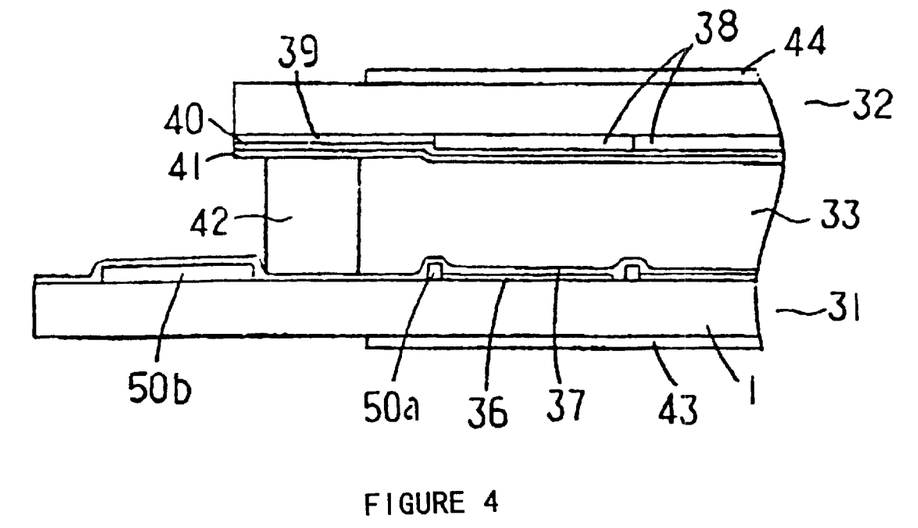
FIG. 4 is a cross sectional view of a liquid crystal display device according to a third embodiment of the invention.

FIG. 4 is a cross sectional view of a liquid crystal display device of the third embodiment. The liquid crystal display device includes an array substrate 31, a counter substrate 32 provided opposite to the array substrate 31 and a liquid crystal material 33 interposed between the array substrate 31 and the counter substrate 32.

TFTs 50a are provided on the array substrate 31 to switch pixels in a display area and pixel electrodes 36 connected thereto are formed. Driving TFTs 50b are provided in a non-display area. An alignment film 37 is formed to cover the TFTs 50a and 50b.

A color filter 38 is formed in the display area on the counter,substrate 32 and a light blocking layer 39 is provided around it. A counter electrode 40 and an alignment layer 41 are entirely laminated on the color filter 38 and the light blocking layer 39.

Opposite inner surfaces of the electrodes formed on the array substrate 31 and the counter substrate 32, respectively, are bonded by a seal material 42. Polarizers 43 and 44 are attached to the outer surface of array substrate 31 and counter substrate 32, respectively.

Figure 5:
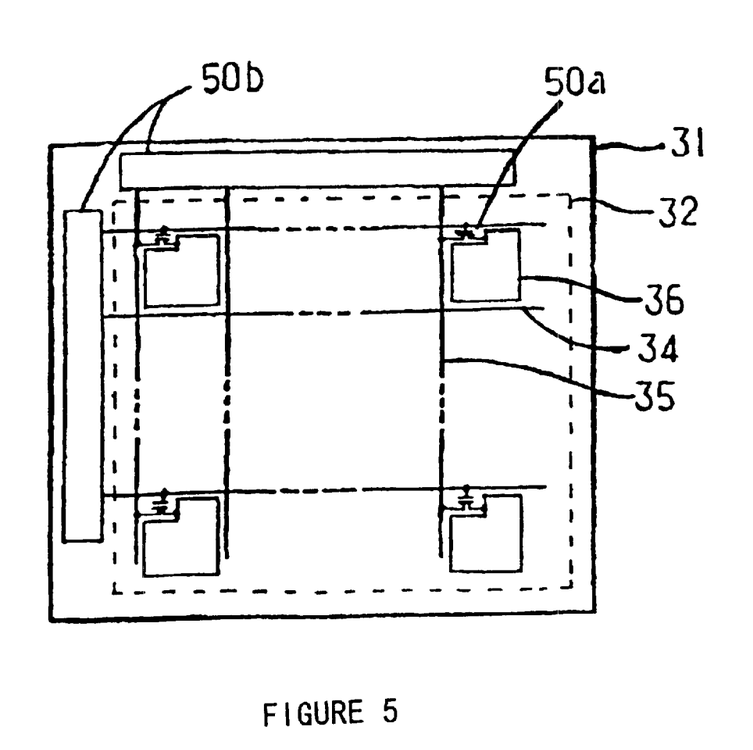
FIG. 5 is a plan view of the liquid crystal display device described in FIG. 4.

FIG. 5 is a plan view of the liquid crystal display device. In the display area of array substrate 31, scanning and signal lines 34 and 35 are provided in a matrix form and pixel switching TFTs are formed at locations in the vicinity of cross points thereof. The pixel electrodes 36 are provided, corresponding to apertures defined by the matrix of scanning and signal lines 34 and 35.

The driving TFTs 50b are made in the non-display area on array substrate 31. The pixel switching and driving TFTs 50a and 50b are made of the TFT 10 or 60 (the first or second embodiment of the present invention). The driving TFT 50b has generally a C-MOS structure composed of p-type and n-type TFTs. Since the p-type TFT has a lower degree of the deterioration caused by the electric field concentration than the n-type TFT, the LDD structure may be applied only to the n-type TFT.

This invention is applicable to an array substrate with such structure that pixel electrodes are provided on a TFT through insulation films and also to a liquid crystal display device including an array substrate on which color filters and light blocking layers are formed.

Fourth Embodiment

A method of manufacturing the C-MOS transistor composed of p-type and n-type TFTs will be hereinafter described with reference to FIGS. 6(a) through 6(h).

Figures 6A, 6B, 6C, 6D:
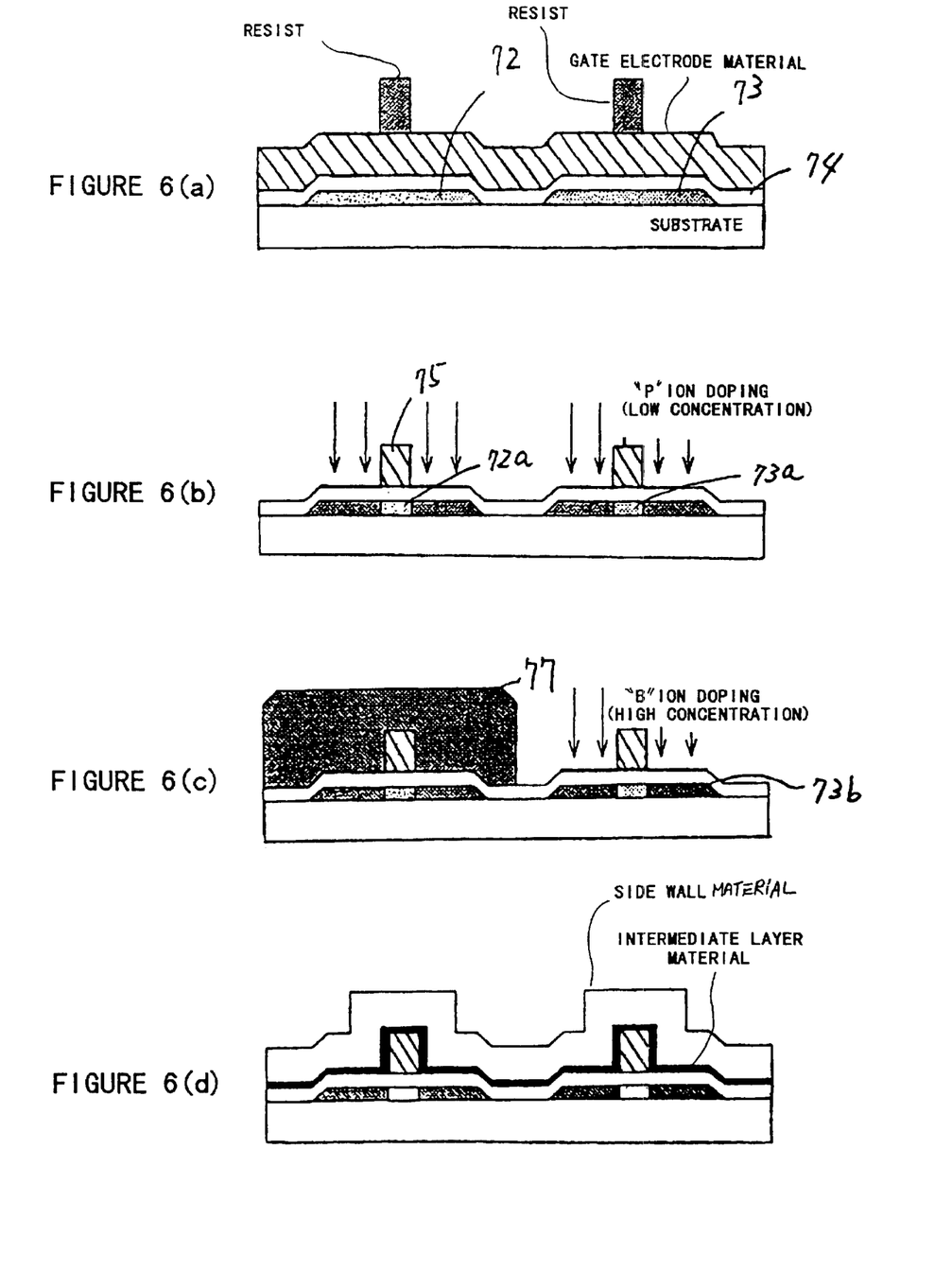
FIGS. 6(a) through 6(h) are production process diagrams of a TFT according to a third embodiment of the invention.

The same manufacturing method as in the first embodiment is used until making a p-Si layer. Semiconductor layers 72 and 73 are patterned in island-like configurations in regions where the n-type and p-type TFTs are formed. A silicon oxide film is, then, entirely formed by the CVD process to make a gate insulation layer 74 as shown in FIG. 6 (a).

A gate electrode material is formed on the gate insulation layer 74 and a patterning process is applied thereto to make gate electrodes 75 and 76 on the n-type and p-type semiconductor layers, respectively.

As shown in FIG. 6(b), phosphorus material is lightly doped into the semiconductor layers 72 and 73 around the gate electrodes 75 and 76 as masks. The regions of semiconductors 72 and 73 masked by the gate electrodes 75 and 76 are made into channel regions 72a and 73a, respectively. A resist film is formed entirely on the device surface. The resist film is so patterned that a resist mask 77 covers the n-type TFT region but that the resist film on the p-type TFT region is subject to removal.

As shown in FIG. 6(c), a high concentration boron material is doped to form a lower resistance region 73b. In short, the boron material is doped into the semiconductor layer 73 around the gate electrode 76 as a mask. The doping conditions are an acceleration voltage of 50 kV and a dose quantity of $1\times10^{16}/cm^2$, for example.

Figure 6E:
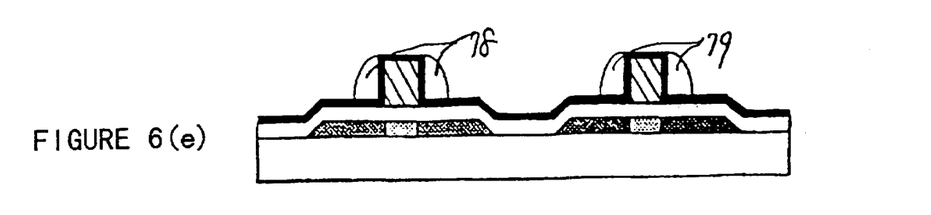
Figure 6F:
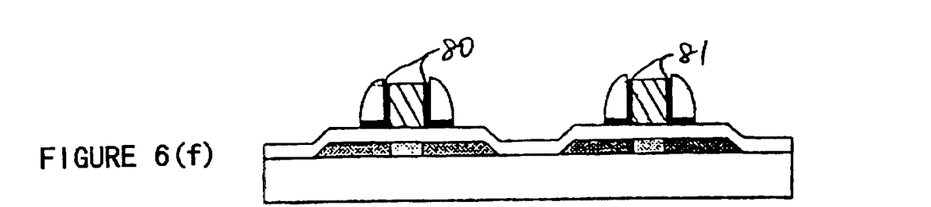

The resist mask 77 is removed from the n-type TFT and an intermediate material of Ti or the like is entirely coated on the device surface. Further, silicon oxide as a material used for the side wall is formed on the intermediate layer. As shown in FIG. 6(e), the silicon oxide is removed by the anisotropic etching to form the side walls 78 and 79. The intermediate material is further patterned to make intermediate layers 80 and 81 around the side walls 78 and 79 as masks, respectively.

Figure 6G:
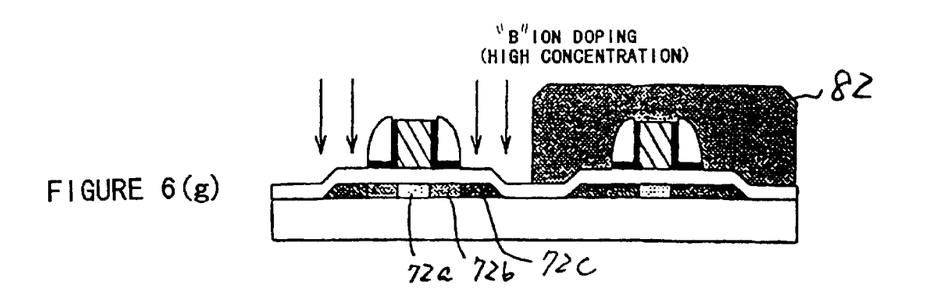
Figure 6H:
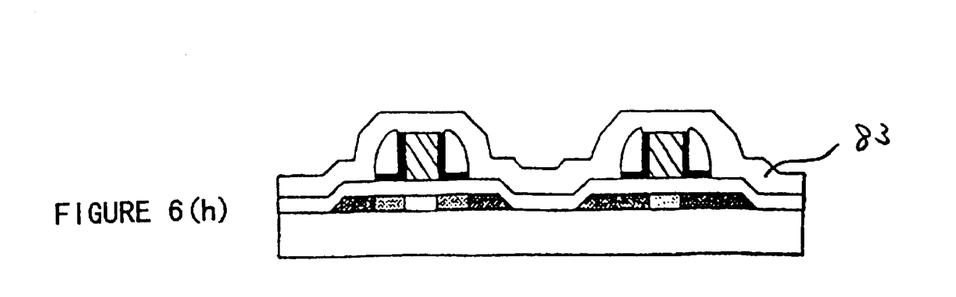

A resist film is again so formed that a resist mask 82 covers the p-type TFT region but that the resist film on the n-type TFT region is subject to removal. As shown in FIG. 6(g), a high concentration phosphorus material is doped using the side wall 78 as a mask to make a lower resistance layer 72c in the semiconductor layer 72. A region masked by the side wall 78 remains unchanged as an LDD region 72b. The resist mask 82 covering the p-type TFT region is then removed and an insulation layer 83 is formed as shown in FIG. 6(h). As in the first embodiment, contact holes (not shown) and the source and drain electrodes (not shown) are then formed, and the C-MOS TFTs are completed. The processes in this embodiment which are common with those in the first embodiment are performed under the same conditions as in the first embodiment.

Fifth Embodiment

A method of making both driving TFTs and pixel switching TFTs at the same time will be explained with reference to FIGS. 7(a) through 7(h). In this embodiment, however, the driving TFTs has a C-MOS structure consisting of a combination of the n-type and p-type TFTs while the pixel switching TFTs are the n-type. Thus, the processes shown in FIGS. 7(a) through 7(f) are the same as in the C-MOS structure of the fourth embodiment. The pixel switching TFT is also made in the same way as the n-type TFT in the C-MOS structure. For the sake of simplicity, processes after those set forth above will be described hereinafter.

Figure 7A:
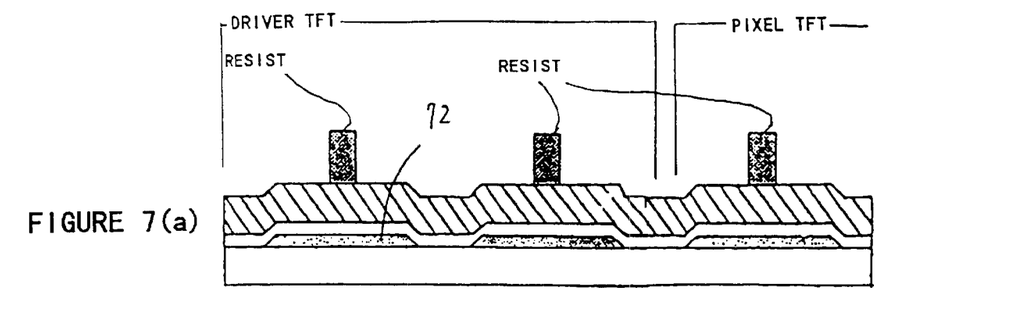
FIGS. 7(a) through 7(h) are production process diagrams of a TFT according to a fourth embodiment of the invention.
Figure 7B:
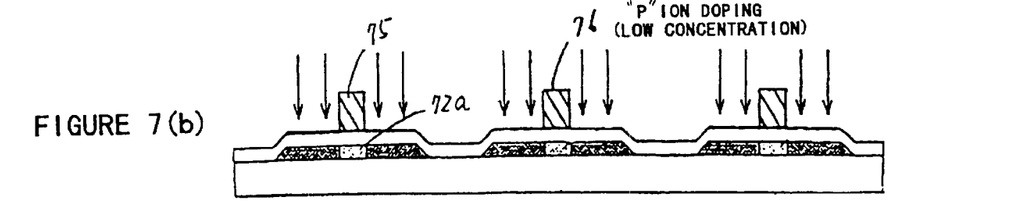
Figure 7C:
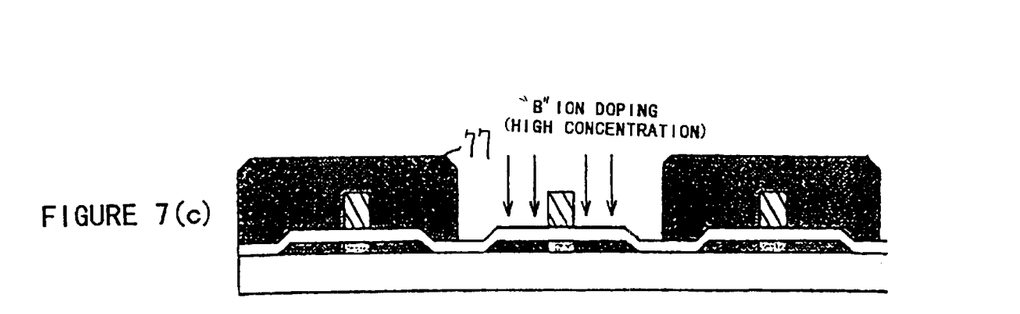
Figure 7D:
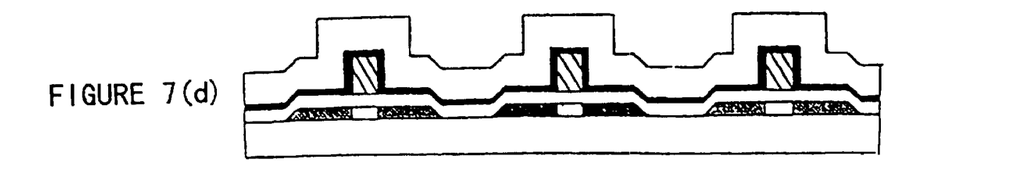
Figure 7E:
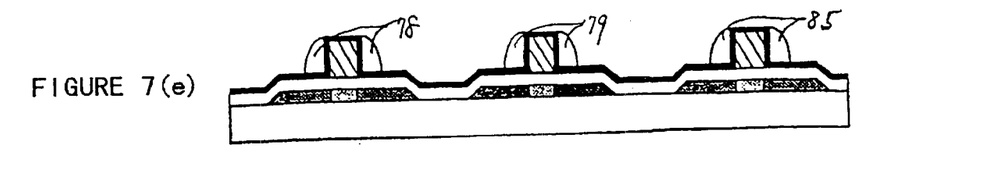
Figure 7F:
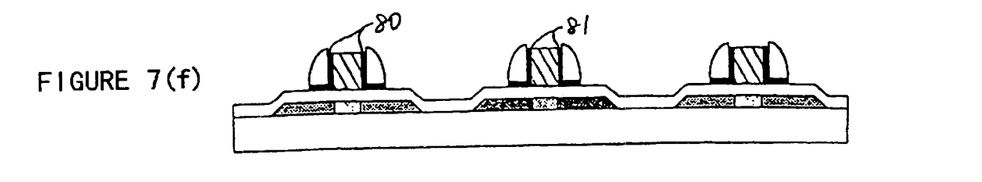
Figure 7G:
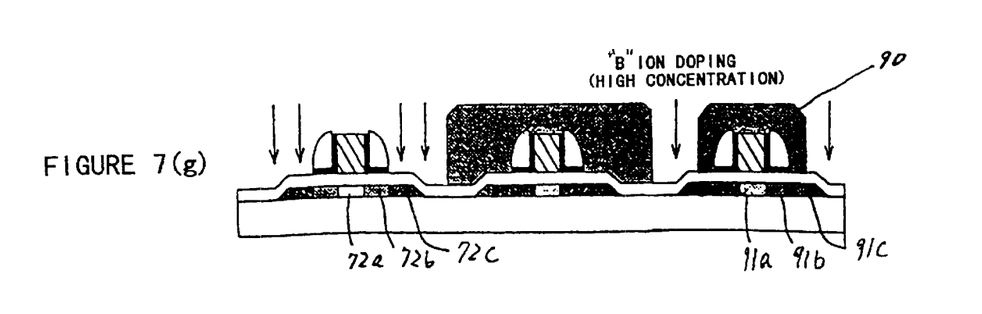
Figure 7H:
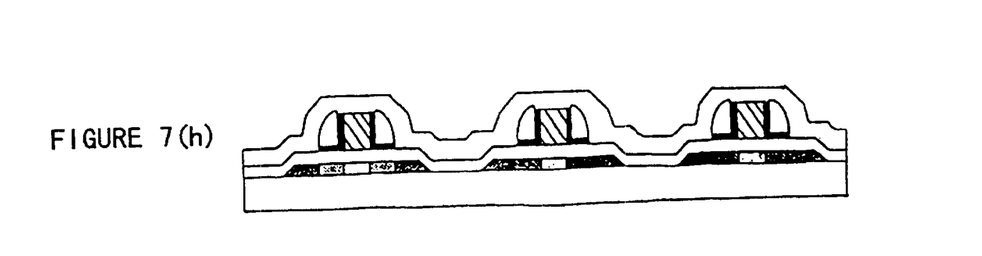

After the process shown in FIG. 7(f), although the resist material 83 is coated to cover the p-type TFT in the fourth embodiment, a resist material 90 is coated to cover also the pixel switching TFT region at the same time as shown in FIG. 7(g). The width of this resist material 90 is wider than that of the side wall 85 for the pixel switching TFT but is narrower than that of the semiconductor layer so that the source/drain regions 91c are not covered but exposed. A high concentration phosphorus material is doped into the regions 72c and 91c around the resist material 83 and 90 as masks, respectively. As a result, the lateral length of the LDD region 91b for the switching TFT is longer than that of the LDD region 72b for the driving TFT.

According to this embodiment, the driving TFT has a minimum length LDD region to comply with a requirement for a high driving capability. The pixel switching TFT, on the other hand, has a laterally longer LDD region than the driving TFT in order to avoid a leakage current due to discharge of electric charges stored in the pixel at its switching-off time.

The present invention provides a novel LDD TFT, a method of making the same in which a layer underneath a side wall and a substrate made of a glass sheet are less damaged by an etching process through which the side wall is made, and a liquid crystal display device including such an LDD TFT.

This invention provides a great advantage in that it increases the scope of choices of materials usable as a side wall so that appropriate material can be selected in accordance with process conditions and TFT structure.

The present invention provides a method of manufacturing a liquid crystal display device precisely in which thin film transistors with a high driving capability are made for driving circuits and thin film transistors with a lower leakage current characteristic at the switching-off time are made for switching pixel electrodes.

What we claim is:

1. An active matrix type display device comprising:

a glass substrate;

scanning and signal lines formed on said glass substrate in a matrix form;

switching thin film transistors formed in the vicinity of cross points of said scanning and signal lines;

pixel electrodes connected to said switching thin film transistors; and driving thin film transistors formed at peripheral portions of said glass substrate to drive said switching thin film transistors;

wherein at least one of said driving thin film transistors includes, a semiconductor layer having source and drain regions, a channel region provided between said source and drain regions, and a lightly doped impurity region formed between said channel region and at least one of said source and drain regions, a gate insulation layer formed on said semiconductor layer, a gate electrode formed on said gate insulation layer, a side wall provided around said gate electrode to form said lightly doped impurity region, and an intermediate layer provided between said lightly doped impurity region and said side wall, said intermediate layer being made of a metal material and connected to said gate electrode.

2. The active matrix type display device according to claim 1, wherein said side wall is formed in a self-alignment fashion with respect to said gate.

3. The active matrix type display device according to claim 1, wherein said intermediate layer is formed in a self-alignment fashion with respect to said side wall.

4. The active matrix type display device according to claim 1, wherein said side wall is made of a material selected from silicon oxide, silicon nitride and silicon oxynitride.

5. The active matrix type display device according to claim 4, wherein said metal is one selected from materials of Ti, Mo, W, Ta, and Al, and an alloy made of at least two metals thereof.

6. The active matrix type display device according to claim 1, wherein said semiconductor layer is made of polycrystalline silicon and said gate insulation layer and said side wall are made of silicon oxide.

7. The active matrix type display device according to claim 1, wherein said side wall is made of silicon oxide containing carbon, the concentration of which ranges from $1 \times 10^{18}/cm^3$ through $1 \times 10^{21}/cm^3$.

8. The active matrix type display device according to claim 1, comprising:

said lightly doped impurity region being aligned with said side wall.

9. The active matrix type display device according to claim 1, comprising:

said intermediate layer formed on said gate insulator film.

10. The active matrix type display device according to claim 9, comprising:

a thickness of said gate insulator film under said intermediate layer being substantially the same as a thickness of said gate insulator film under said gate electrode.

* * * * *